US010939588B2

United States Patent
Long et al.

(10) Patent No.: US 10,939,588 B2
(45) Date of Patent: Mar. 2, 2021

(54) AIRFLOW DISTRIBUTION AND MANAGEMENT ARCHITECTURE FOR LARGE DATA CENTER

(71) Applicant: SCHNEIDER ELECTRIC IT CORPORATION, West Kingston, RI (US)

(72) Inventors: Rong Long, St. Louis, MO (US); Kenneth Schaller, O'Fallon, MO (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 91 days.

(21) Appl. No.: 16/201,225

(22) Filed: Nov. 27, 2018

(65) Prior Publication Data
US 2019/0166723 A1    May 30, 2019

Related U.S. Application Data

(60) Provisional application No. 62/592,760, filed on Nov. 30, 2017.

(51) Int. Cl.
*H05K 7/20* (2006.01)

(52) U.S. Cl.
CPC ..... *H05K 7/20745* (2013.01); *H05K 7/20836* (2013.01)

(58) Field of Classification Search
CPC ........... H05K 7/20709; H05K 7/20718; H05K 7/20727; H05K 7/20748; F24F 7/10; F24F 13/0227; F24F 13/068; F24F 13/14; F24F 13/16
USPC ........................................ 454/184, 247, 289
See application file for complete search history.

(56) References Cited

U.S. PATENT DOCUMENTS

| | | | |
|---|---|---|---|
| 6,859,366 B2 | 2/2005 | Fink | |
| 7,046,514 B2 | 5/2006 | Fink et al. | |
| 9,585,266 B2* | 2/2017 | Krietzman | H05K 5/0213 |
| 9,723,762 B1 | 8/2017 | Ross et al. | |
| 2003/0050003 A1 | 3/2003 | Charron | |
| 2009/0277605 A1* | 11/2009 | VanGilder | G06F 1/20 |
| | | | 165/67 |
| 2011/0271610 A1 | 11/2011 | Cottuli et al. | |
| 2013/0276389 A1* | 10/2013 | Marrs | E04B 2/74 |
| | | | 52/173.1 |
| 2017/0121966 A1 | 5/2017 | Jiang et al. | |
| 2017/0127569 A1 | 5/2017 | Rimler et al. | |

OTHER PUBLICATIONS

Extended European Search Report from correspondiing European Application No. 18209105.8 dated Apr. 3, 019.

\* cited by examiner

*Primary Examiner* — Vivek K Shirsat
(74) *Attorney, Agent, or Firm* — Lando & Anastasi, LLP (57) ABSTRACT

A data center includes a structure having a floor, walls and a roof, and a plurality of rows of equipment racks positioned within the structure. The rows of equipment racks are arranged parallel to one another, with the rows of equipment racks defining alternating hot aisles and cold aisles. Each hot aisle is contained within the structure and in fluid communication with a hot aisle return. Each cold aisle includes a plurality of ceiling panels to contain air in the cold aisle. Each ceiling panel is configured to extend between equipment racks of adjacent rows of equipment racks to define the cold aisle and/or configured to extend between equipment racks of a row of equipment racks and an aisle end wall to define the cold aisle.

18 Claims, 9 Drawing Sheets

AIRFLOW DISTRIBUTION AND MANAGEMENT ARCHITECTURE FOR LARGE DATA CENTER

CROSS-REFERENCE TO RELATED APPLICATION

This application claims priority to U.S. Provisional Patent Application No. 62/592,760, filed Nov. 30, 2017, titled AIRFLOW DISTRIBUTION AND MANAGEMENT ARCHITECTURE FOR LARGE DATA CENTER, which is incorporated by reference in its entirety for all purposes.

BACKGROUND OF THE DISCLOSURE

Technical Field

The technical field relates generally to managing temperature and humidity within a data center, and more particularly to an airflow distribution and management architecture for a large data center.

Background Discussion

Equipment enclosures or racks for housing electronic equipment, such as data processing, networking and telecommunications equipment have been used for many years. Such racks are often used to contain and to arrange the equipment in large equipment rooms and data centers. In certain embodiments, an equipment storage rack can be an open configuration and can be housed within a rack enclosure, although the enclosure may be included when referring to a rack.

Management systems have been developed to manage the power distribution and cooling systems of data centers containing racks. Specifically, heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. A disadvantage of some cooling systems is that cool air is mixed with the room temperature air, which is inefficient.

In order to control the flow of air throughout the data center, and to optimize the air flow as described above, it may be desirable to contain the air within the hot and cold aisles, and in particular, the hot aisle. However, for existing data centers, it may be difficult to retrofit the equipment and cooling units with "standard" containment systems that require significant customization. Examples of hot aisle air containment systems may be found in U.S. Pat. Nos. 6,859,366 and 7,046,514.

SUMMARY OF THE DISCLOSURE

One aspect of the present disclosure is directed to a data center comprising a room structure including a floor, walls and a ceiling, and a plurality of rows of equipment racks positioned within the room structure. The rows of equipment racks are arranged parallel to one another, with the rows of equipment racks defining alternating hot aisles and cold aisles. Each hot aisle is contained by the ceiling of the room and in fluid communication with a hot aisle return. Each cold aisle includes a plurality of ceiling panels to contain air in the cold aisle. Each ceiling panel is configured to extend between equipment racks of adjacent rows of equipment racks to define the cold aisle and/or configured to extend between equipment racks of a row of equipment racks and an aisle end wall to define the cold aisle.

Embodiments of the data center further may include configuring each ceiling panel, when extending between equipment racks of adjacent rows of equipment racks to define the cold aisle, to be secured to a brush strip mounted on a top of the equipment racks. Each ceiling panel, when extending between equipment racks of a row of equipment racks and an aisle end wall to define the cold aisle, may be secured at one end to a brush strip on top of the equipment rack and at an opposite end to the aisle end wall by another brush strip. Each ceiling panel may have a width equivalent to a width of the equipment rack and a length sufficient to span a distance between adjacent rows of equipment racks.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

One aspect of the present disclosure is directed to a data center comprising a structure including a floor, walls and a roof, and a plurality of rows of equipment racks positioned within the structure. The rows of equipment racks are arranged parallel to one another, with the rows of equipment racks defining alternating hot aisles and cold aisles. Each hot aisle is contained within the structure and in fluid communication with a hot aisle return. Each cold aisle includes a plurality of ceiling panels to contain air in the cold aisle. Each ceiling panel is configured to extend between equipment racks of adjacent rows of equipment racks to define the cold aisle and/or configured to extend between equipment racks of a row of equipment racks and an aisle end wall to define the cold aisle.

Embodiments of the data center further may include a common roof plenum disposed above the rows of equipment racks in fluid communication with one or more cooling units, with the common roof plenum functioning as the hot aisle return. The data center further may include a common cold aisle plenum in fluid communication with one or more cooling units to deliver cold air to the cold aisles. Each ceiling panel, when extending between equipment racks of adjacent rows of equipment racks to define the cold aisle, may be secured to a brush strip mounted on a top of the equipment racks. Each ceiling panel, when extending between equipment racks of a row of equipment racks and an aisle end wall to define the cold aisle, may be secured at one end to a brush strip on top of the equipment rack and at an opposite end to the aisle end wall by another brush strip. Each ceiling panel may have a width equivalent to a width of the equipment rack and a length sufficient to span a distance between adjacent rows of equipment racks.

Another aspect of the disclosure is directed to a data center comprising a data center module including a frame structure having floor, walls and a roof. The data center module is configured to house a plurality of rows of equipment racks positioned within the frame structure, with the rows of equipment racks being arranged parallel to one another and defining alternating hot aisles and cold aisles. The data center module further includes a common roof plenum disposed between the roof and the rows of equipment racks to contain and exhaust hot air from the data center module and a common cold aisle plenum receive and deliver cold air to the data center module. The data center further comprises an external duct that functions to receive exhausted hot air from the common roof plenum and to deliver cool air to the common cold aisle plenum; and at least one cooling unit in fluid communication with the external duct. The at least one cooling unit is configured to treat hot air delivered to the at least one cooling unit from the common roof plenum via the external duct.

Embodiments of the data center further may include a plurality of ceiling panels to contain air in the cold aisle. Each ceiling panel may be configured to extend between equipment racks of adjacent rows of equipment racks to define the cold aisle and/or configured to extend between equipment racks of a row of equipment racks and an aisle end wall to define the cold aisle. Each ceiling panel, when extending between equipment racks of adjacent rows of equipment racks to define the cold aisle, may be is secured to a brush strip mounted on a top of the equipment racks. Each ceiling panel, when extending between equipment racks of a row of equipment racks and an aisle end wall to define the cold aisle, may be secured at one end to a brush strip on top of the equipment rack and at an opposite end to the aisle end wall by another brush strip. Each ceiling panel may have a width equivalent to a width of the equipment rack and a length sufficient to span a distance between adjacent rows of equipment racks. Each ceiling panel may be suspended from the roof and configured to extend between equipment racks of adjacent rows of equipment racks to define the cold aisle and/or configured to extend between equipment racks of a row of equipment racks and an aisle end wall to define the cold aisle.

Yet another aspect of the disclosure is directed to a method of managing airflow within a data center including a plurality of rows of equipment racks positioned within the structure, with the rows of equipment racks being arranged parallel to one another, defining alternating hot aisles and cold aisles. The method comprises: delivering hot air to a common roof plenum disposed between a roof of the data center and rows of equipment racks, the common roof plenum being configured to contain and exhaust hot air from the data center module; delivering hot air from the common roof plenum to an external duct that functions to receive exhausted hot air from the common roof plenum; treating hot from the external duct by one or more cooling unit in fluid communication with the external duct; and delivering treated air to the external duct to a common cold in fluid communication with the cold aisles.

Embodiments of the method further may include containing treated air within the cold aisle by a plurality of ceiling panels to contain air in the cold aisle. Each ceiling panel may be configured to extend between equipment racks of adjacent rows of equipment racks to define the cold aisle and/or configured to extend between equipment racks of a row of equipment racks and an aisle end wall to define the cold aisle. The method further may include sealing each ceiling panel, when extending between equipment racks of adjacent rows of equipment racks to define the cold aisle, with a brush strip mounted on tops of the equipment racks. The method further may include sealing each ceiling panel, when extending between equipment racks of a row of equipment racks and an aisle end wall to define the cold aisle, with a brush strip on top of the equipment rack and at an opposite end to the aisle end wall by another brush strip. Each ceiling panel may have a width equivalent to a width of the equipment rack and a length sufficient to span a distance between adjacent rows of equipment racks.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

A typical data center may be designed to house a number of equipment racks. Cabling between the equipment racks may be implemented using cable distribution troughs contained on the roofs of the racks. Although directed to large data centers, the principles of the present disclosure may be adapted to smaller data centers, equipment rooms, and computer rooms. Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. The sides of the equipment rack may include at least one panel to enclose the interior region of the rack. The back of the equipment rack may also include at least one panel or a back door to provide access to the interior of the equipment rack from the back of the rack.

The equipment racks are modular in construction, and can be configured to be positioned within a row of the data center. Once in position, or prior to being positioned within the row, electronic equipment may be placed in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, data centers are typically configured with rows of equipment racks arranged such that cool air is drawn into the racks from a cold aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks in which the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the traditional CRAC units described above. With yet another configuration, a modular cooling system may be provided. The modular cooling system may include a plurality of cooling racks disposed within the data center. For example, one or more cooling racks may be provided around the perimeter of the data center. However, it should be understood that a person skilled in the art, and given the benefit of this disclosure, may provide more or less cooling racks within the data center depending on environmental conditions of the data center. Further in some embodiments, the concentration and locations of cooling racks may be adjusted based on the locations of the hottest racks in the data center, or based on information obtained and analyzed by a data center information management system and the type of equipment housed within the data center.

In one embodiment, a management system may be provided to monitor and display conditions of a cooling rack or of multiple cooling racks. The management system may operate independently to control the operation of the cooling rack, and may be configured to communicate with a higher level network manager or with a management system associated with the equipment storage racks. For example, in a particular embodiment, a controller may be provided to control the operation of the cooling racks. The controller may be a dedicated unit to the cooling system of the data center. In another embodiment, the controller may be provided as part of an integrated data center control and monitoring system. In yet another embodiment, each cooling rack may be independently operable by a controller provided in the cooling rack that is in communication with controllers of the other cooling racks. Notwithstanding the particular configuration, the controller is designed to control the independent operation of the cooling racks within the data center.

For example, the controller may be configured to identify the failure or inability of a particular cooling rack located within the data center to cool the air, and to increase the cooling capacity of a cooling rack or cooling racks located near the failed cooling rack. In another embodiment, one cooling rack may operate as the main or master unit and the other cooling racks operate as subservient units that operate under the control of the main unit. In this embodiment, the main cooling rack may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling racks within the cooling system based on the energy drawn by the equipment racks.

In certain circumstances, it may be desirable to control the air flow within the hot and cold aisles. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle that is designed for the particular equipment rack configuration.

As discussed, in data centers having multiple rows of IT equipment racks, especially large data centers, there are provided multiple hot aisles and cold aisles. Often, cooling units are not deployed evenly within the data center, especially when cooling units are installed on one side of data center because of logistical limitations. Embodiments of an airflow distribution and management architecture addresses air distribution issues by employing cold aisle ceiling panels supported mostly by the equipment racks in lieu of a traditional dropped ceiling suspended from the building.

Reference can be made to a "typical" data center having even and uneven loads. In one embodiment, the data center has a 1,000 kW IT server load capacity, and includes 136 standard equipment racks arranged in twelve rows. Specifically, in one embodiment, the data center includes a 12-bay layout having twelve rows of equipment racks that are configured to define, in one embodiment, six hot aisles and seven cold aisles, or in another embodiment, seven hot aisles and six cold aisles. In one embodiment, each row of equipment racks may include a predetermined number (e.g., 10-12) of equipment racks. The cold aisles are in fluid communication with a common cold aisle at the backs of the rows of equipment racks. The common cold aisles are in fluid communication with six air economizer units by a return air plenum. Supply air is provided to the air economizer units, e.g., cooling units, by a supply air plenum.

In some embodiments, the hot aisles are contained by a roof or ceiling associated with the data center in which an entire roof area disposed above the equipment racks can be used for hot air return via the supply air plenum. For example, a roof structure can be disposed over the rows of equipment racks. Embodiments of the present disclosure are directed to an airflow distribution and management architecture that is configured to contain cold air within the cold aisle. One disadvantage associated with prior structures used to enclose cold aisles is that air leaks between ceiling panels used to enclose the top or roof of the cold aisle, between adjacently placed equipment racks, and between panels used to enclose ends of the equipment racks.

In one embodiment, each cold aisle includes a plurality of ceiling panels to enclose the cold aisle. Specifically, several ceiling panels, e.g., one for each equipment rack, are provided to span the cold aisle between adjacent rows of equipment racks to completely enclose the cold aisle. For example, the ceiling panel may have a width matching a width of the equipment rack and a length sufficient to span the distance between adjacent rows of equipment racks. Thus, each cold aisle is used solely for distributing cold air. In this embodiment, the hot aisles are contained solely within a common roof plenum defined by the roof structure disposed above the rows of equipment racks.

In one embodiment, a portion of the data center having several rows of equipment racks defining hot aisles and cold aisles. As shown, the rows of equipment racks are enclosed by an IT prefabrication module, which can be configured to provide essential utilities to the rows of equipment racks. The IT prefabrication module includes an end door and a roof structure, which as described above, functions as common roof plenum to contain hot air and distribute the hot air to the air economizer unit (cooling unit) via the supply air plenum. Cold aisle containment is achieved by ceiling panels that extend between adjacent rows of equipment racks or from a row of equipment racks to a wall of the IT prefabrication module. As will be described in greater detail below, the ceiling panels are designed to create an airtight structure to prevent leakage of cold air contained in each cold aisle to the hot air contained within the hot aisles and the hot air plenum.

Figure 1:
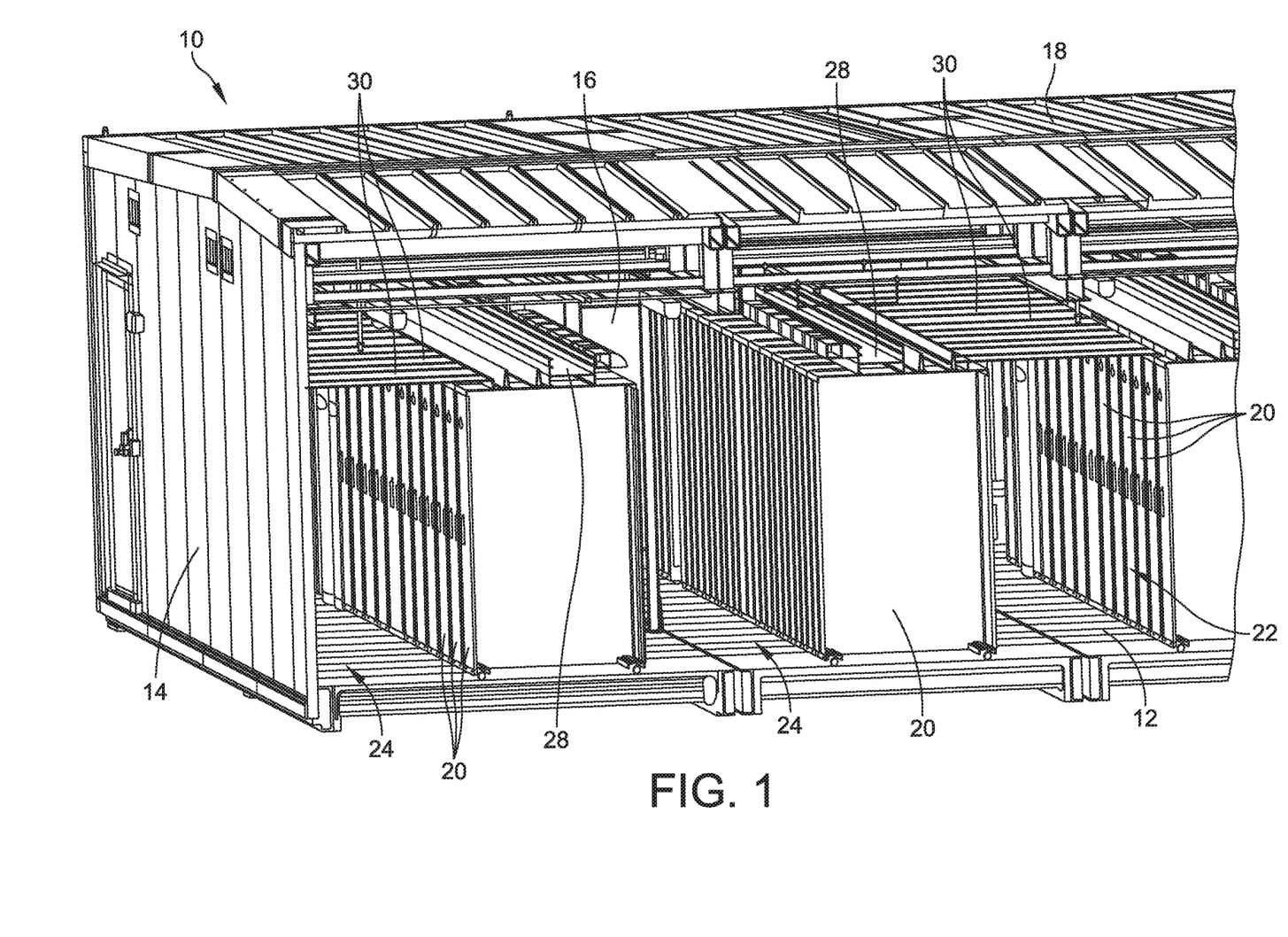
FIG. 1 is a perspective view of a portion of an IT prefabrication module of an embodiment of the present disclosure.
Figure 2:
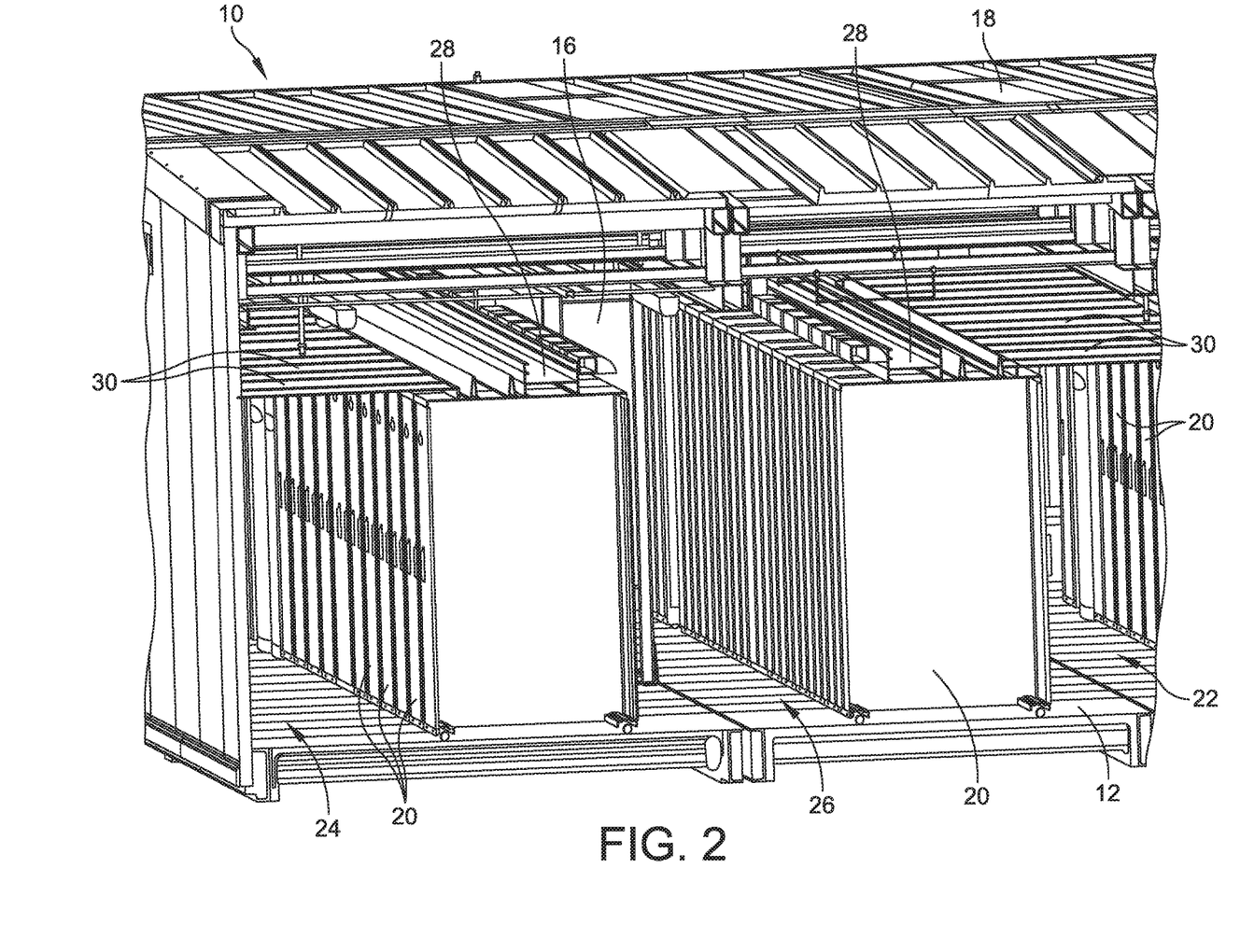
FIG. 2 is an enlarged perspective view of the portion of the IT prefabrication module shown in FIG. 1.

Referring now to the drawings, and more particularly to FIGS. 1 and 2, a portion of an IT prefabrication module, which functions as a data center, is generally indicated at 10. In the shown embodiment, the IT prefabrication module 10 is an enclosed structure, having a floor 12, an end wall 14, an opposite end wall not shown in FIGS. 1 and 2, a back wall 16 and a front wall that is removed to reveal the interior of the module. The IT prefabrication module 10 further includes a roof structure 18 that is supported by the walls, including end wall 14 and back wall 16. As shown, the roof structure 18 includes several panels, which can be fabricated from sheet metal and attached to one another along adjacent edges. The IT prefabricated module 10 further can include many features, such as doors, vents, connection portals and the like. The IT prefabrication module 10 is modular in construction and can be assembled from prefabricated components.

As mentioned above, the IT prefabrication module 10 is configured to provide essential utilities to the rows of equipment racks. Such utilities include, among other things, power and cooling components. The roof structure 10 of the IT prefabrication module 10 includes functions as common roof plenum to contain hot air and distribute the hot air to the air economizer unit (cooler unit) via a supply air plenum. The floor 12 of the IT prefabrication module 10 is configured to support rows of equipment racks, each indicated at 20, which are positioned to define a cold aisle, e.g., cold aisles generally indicated at 22, 24, and a hot aisle, e.g., hot aisle generally indicated at 26. As shown, power and cabling are provided on top of the equipment racks via cable/power trays, each indicated at 28, in the traditional manner. As described above, the equipment racks 20 can embody racks that support electronic equipment (e.g., data processing, networking and telecommunications equipment) and/or power equipment (e.g., uninterruptible power supplies (UPSs), power modules and power strips). The equipment racks 20 can also embody cooling equipment. As shown, the cold aisle 22 is defined between two rows of equipment racks 20 and the cold aisle 24 is defined between a row of equipment racks 20 and the end wall 14.

Cold aisle containment is achieved by ceiling panels, each indicated at 30, that extend between adjacent rows of equipment racks 20 over cold aisle 22 or from a row of equipment racks 20 to the end wall 14 of the IT prefabrication module 10 over cold aisle 24. The ceiling panels 30 when assembled and installed over the cold aisles 22, 24 are designed to create an airtight structure to prevent leakage of cold air contained in each cold aisle to the hot air contained within the hot aisle 26 and the hot air plenum. As described above, cold air is delivered to the cold aisles 22, 24 by a common cold aisle positioned along the back wall 16 of the IT prefabricated module 10. For example, the cold aisles 22, 24 are in fluid communication with one or more air economizer units by the common cold aisle. The hot air is removed from the hot aisle 26 and delivered to the air economizer units by a supply air plenum.

Figure 3:
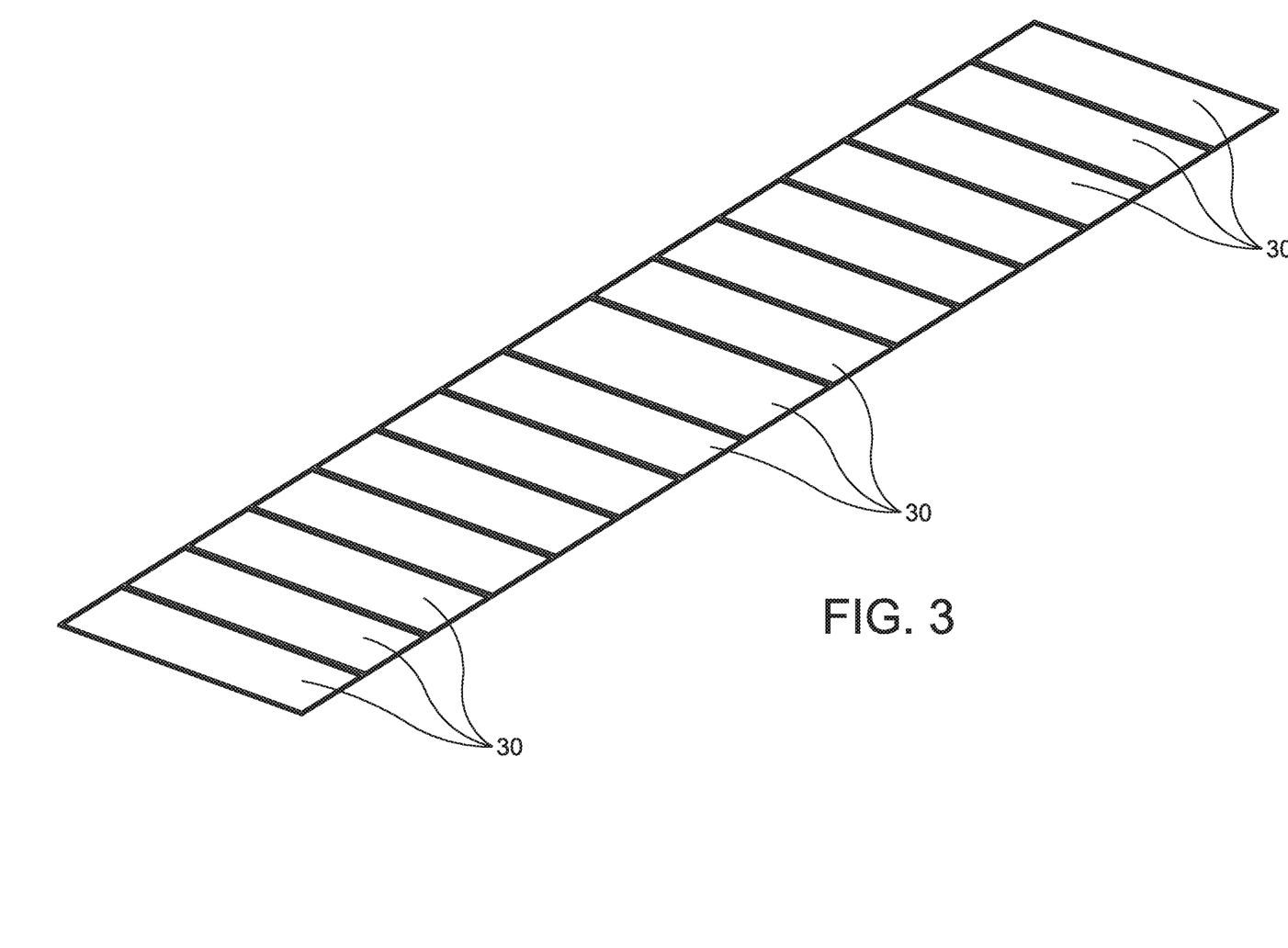
FIG. 3 is a perspective view of several ceiling panels of an embodiment of the present disclosure.
Figure 4:
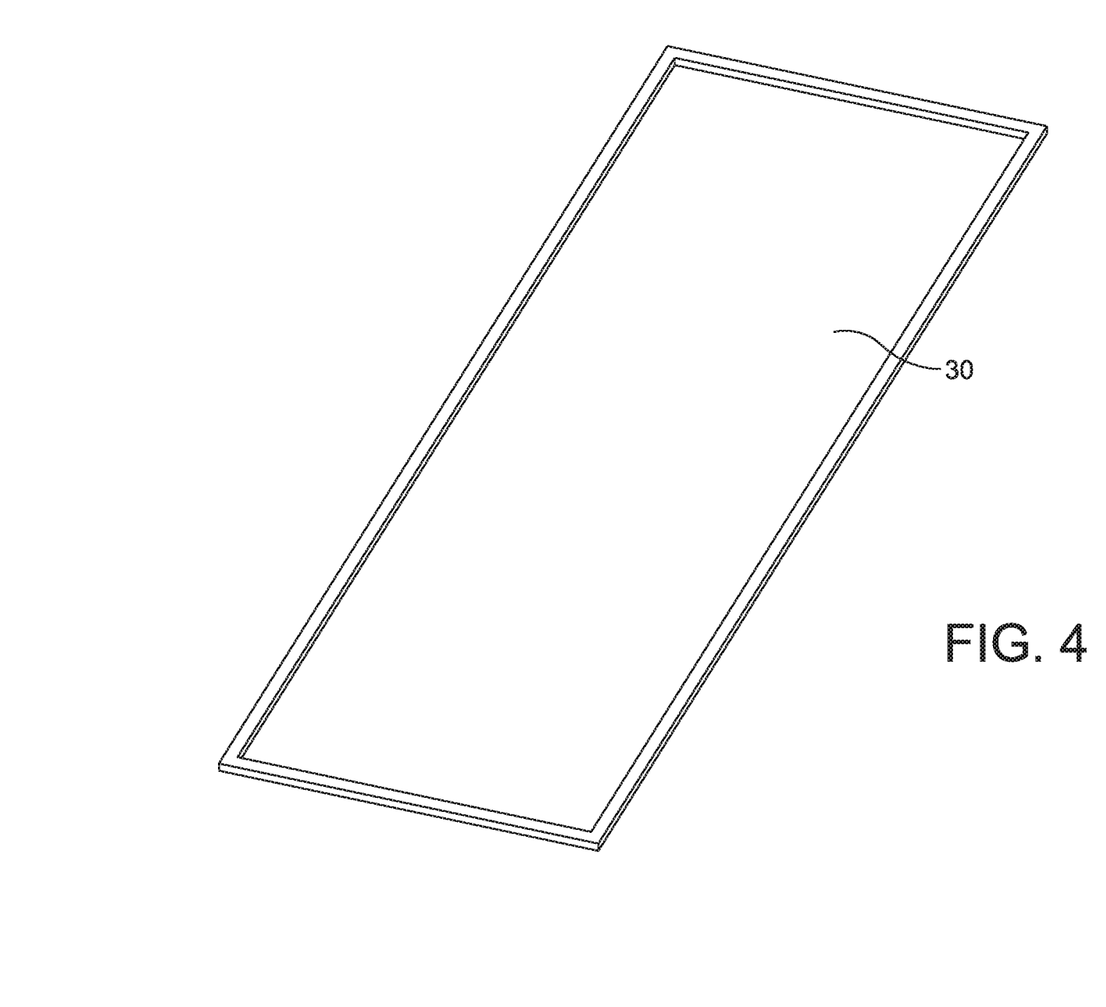
FIG. 4 is a perspective view of a single ceiling panel shown in FIG. 3.

FIG. 3 illustrates a plurality of ceiling panels 30 that provide a ceiling structure between rows of equipment racks. As shown, the ceiling panels 30 are positioned adjacent one another to create an airtight seal between the ceiling panels. FIG. 4 illustrates a single ceiling panel 30. In one embodiment, the ceiling panel 30 has a width equivalent to a width of the equipment rack 20 and a length sufficient to span the distance between adjacent rows of equipment racks. However, it should be understood that the width and length of each ceiling panel 30 may be selected based on the design constraints associated with the layout of the IT prefabrication module 10. For example, each ceiling panel 30 may have a width equivalent to the width of two adjacently placed equipment racks 20. In another embodiment the ceiling panels do not have to be a width equivalent to the widths of the equipment racks, but instead be of any size or shape and suspended from the roof structure 18 of the IT prefabrication module 10.

Figure 5:
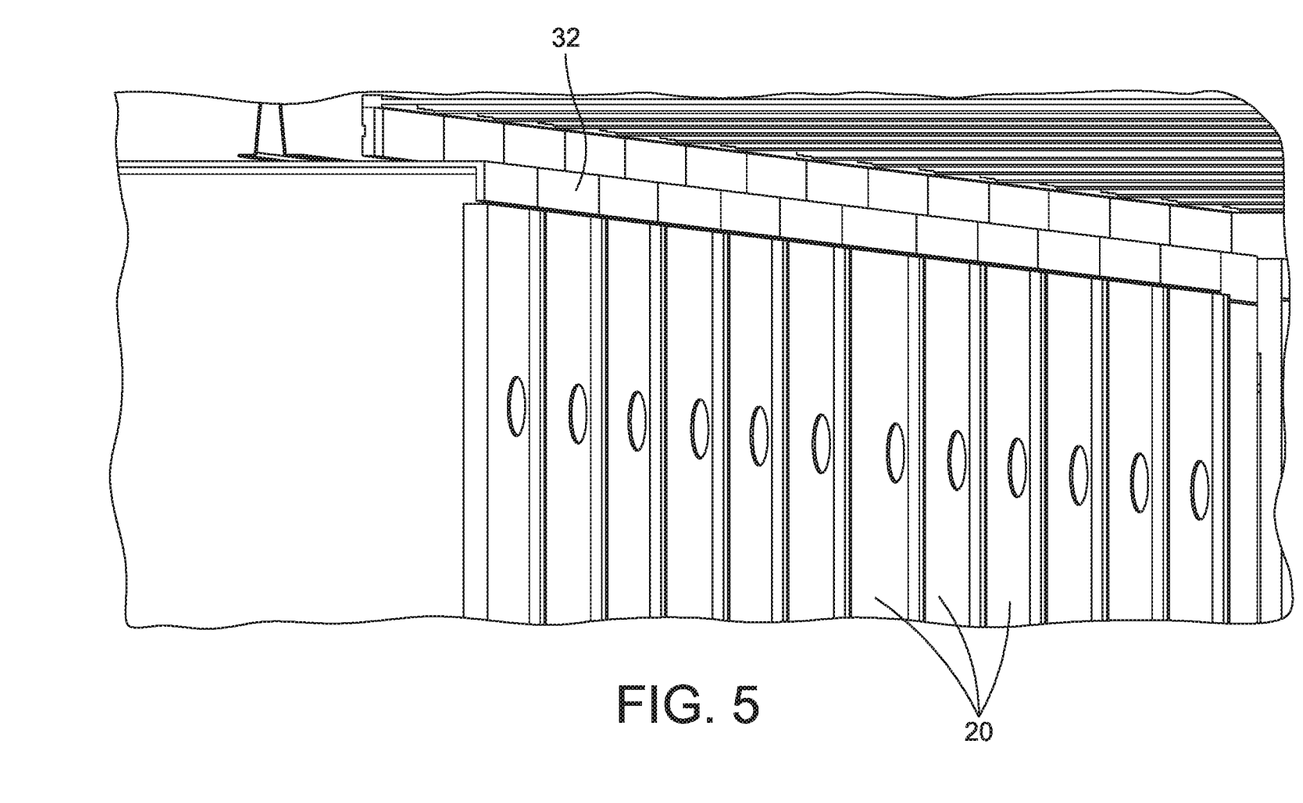
FIG. 5 is an enlarged perspective view of a portion of the IT prefabrication module.
Figure 5A:
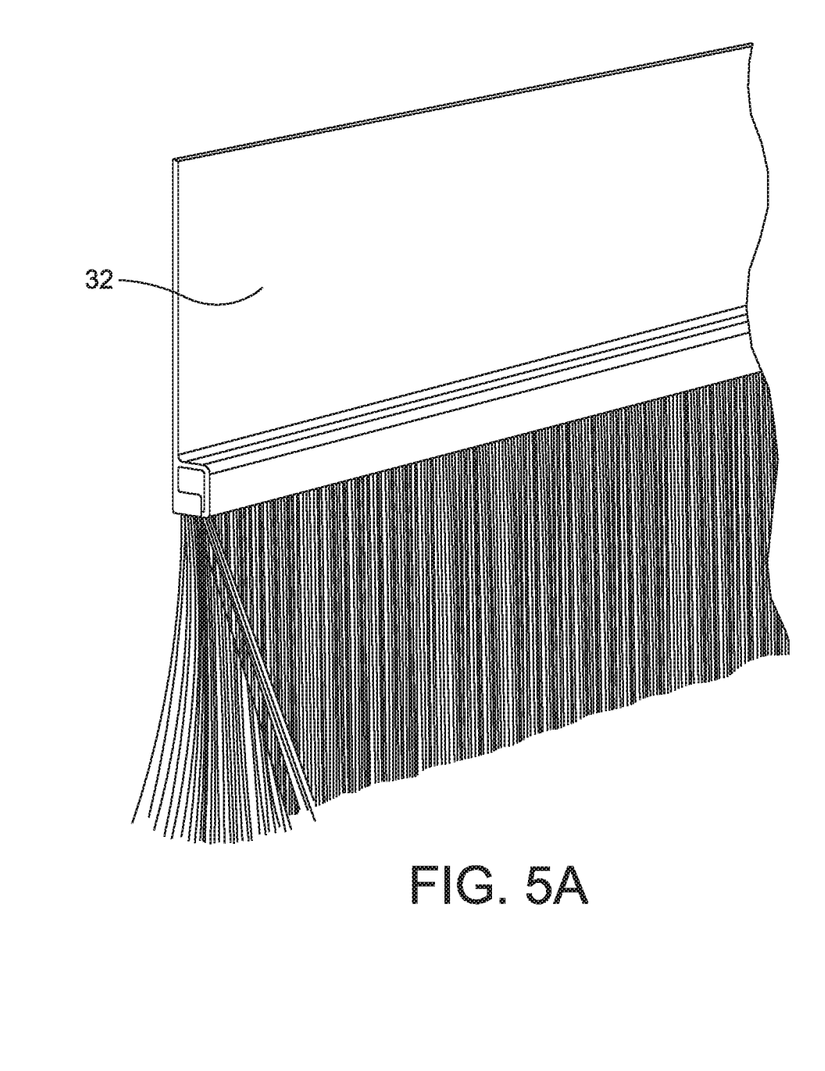
FIG. 5A is a perspective view of a brush strip of an embodiment of the present disclosure.

FIG. 5 illustrates a ceiling panel 30 mounted on a brush strip 32 positioned on top of a rack row. As shown, the brush strip 32 extends along a length of the row of equipment racks 20 and is configured to provide an airtight fit between the ceiling panels 30 and the brush strip when mounting the ceiling panels on the brush strip. For example, the brush strip 32 can embody the brush strip shown in FIG. 5A. The brush strip 32 can be either mounted on the ceiling panel 30 or ceiling panel mounting brackets, or secured to a roof of the equipment rack 20.

Figure 6:
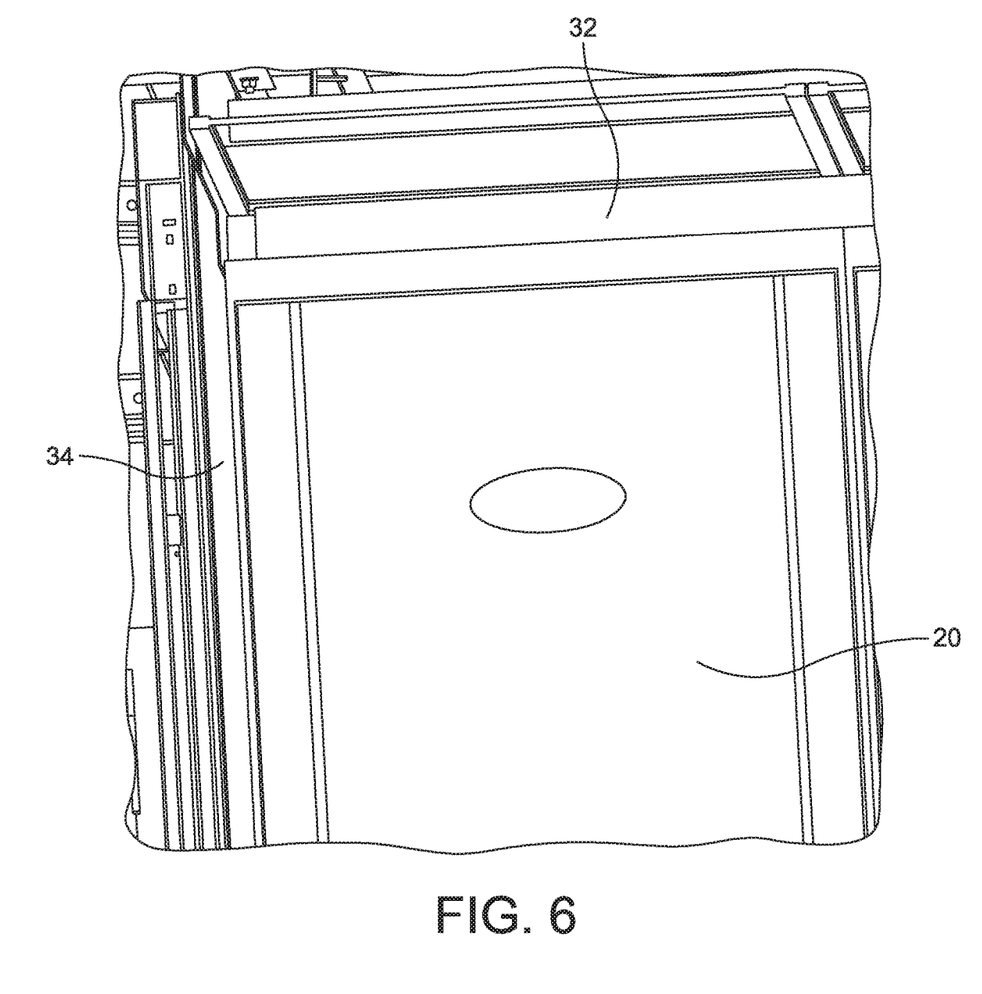
FIG. 6 is an enlarged perspective view of another portion of the IT prefabrication module.

FIG. 6 illustrates a ceiling panel 30 mounted on an aisle end wall 14 of the IT prefabrication module 10. As shown, a brush strip 34 is mounted on the aisle end wall 14 and the ceiling panel 30 is disposed on the brush strip to create an airtight fit. The brush strip 34 can be the same as the brush strip 32 illustrated in FIG. 5A, and can be selected from a group of brush strips having varying brush lengths.

Figure 7A:
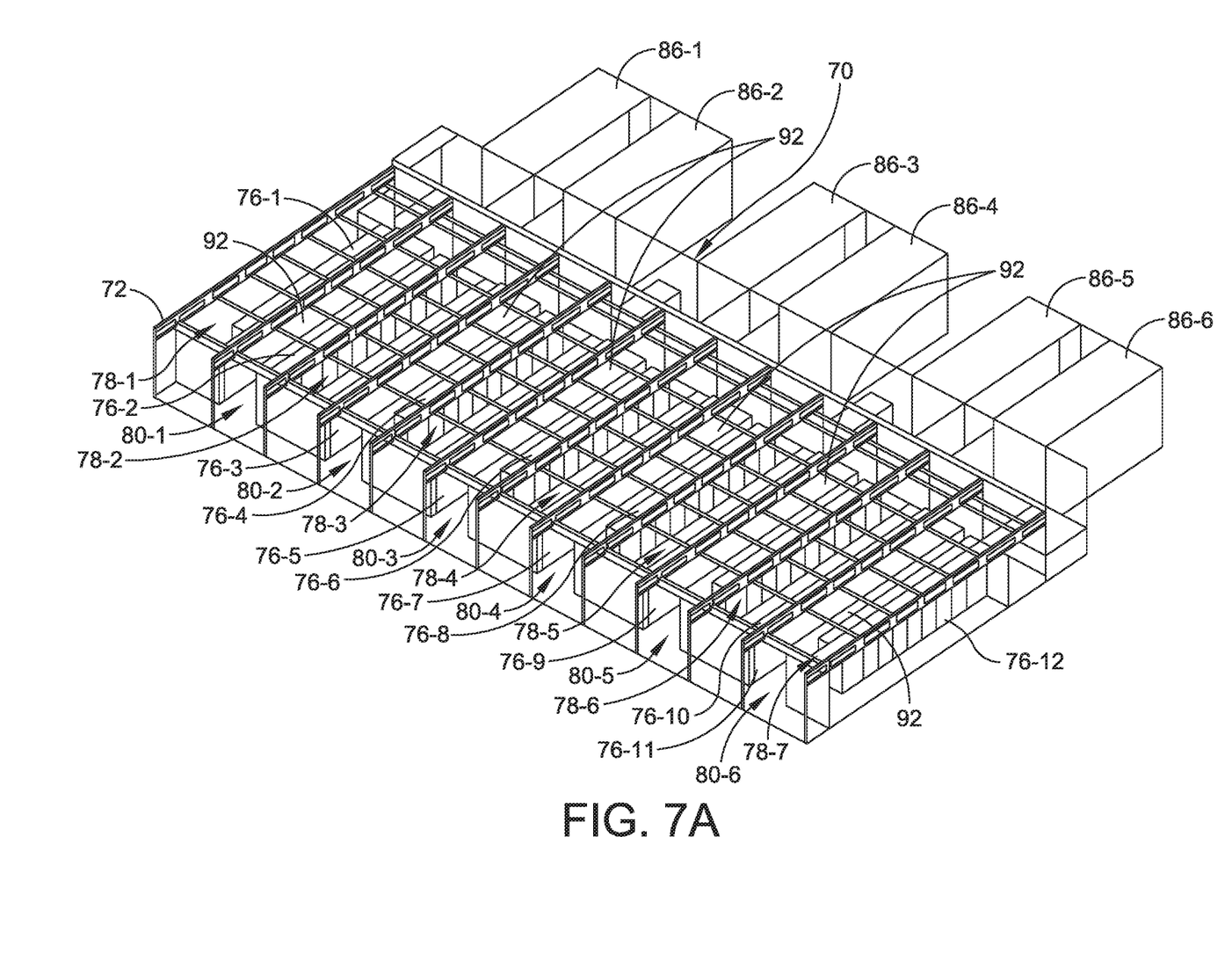
FIG. 7A is a perspective view of an exemplary layout of a data center.
Figure 7B:
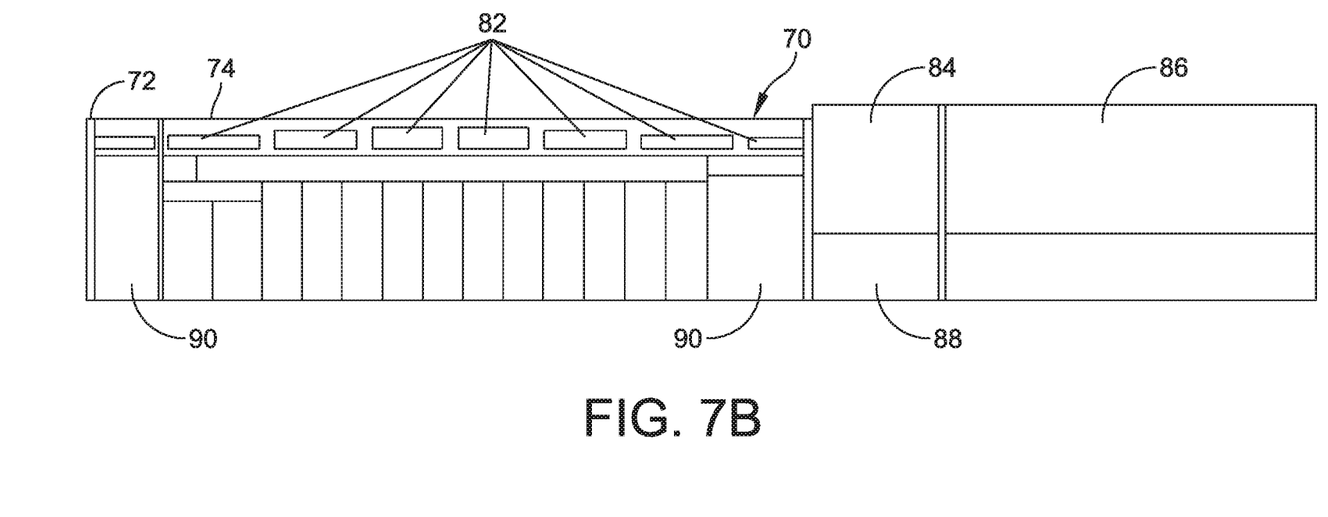
FIG. 7B is side view of the data center shown in FIG. 7A.

Referring to FIGS. 7A and 7B, an exemplary data center module is generally indicated at 70. As shown, the data center module 70 includes a frame structure 72 configured to surround a plurality of aisles of equipment racks. The frame structure includes a front, a back, sides, and a roof 74. In the shown embodiment, there are twelve rows of equipment racks, i.e., rows 76-1, 76-2, 76-2, 76-4, 76-5, 76-6, 76-7, 76-8, 76-9, 76-10, 76-11, 76-12, thereby resulting in seven hot aisles, i.e., hot aisles 78-1, 78-2, 78-3, 78-4, 78-5, 78-6, 78-7, and six cold aisle, i.e., cold aisles 80-1, 80-2, 80-3, 80-4, 80-5, 80-6. As referenced above, the data center module 70 is a "typical" data center having even and uneven loads. In one embodiment, the data center has a 1,000 kW IT server load capacity, and includes 136 standard equipment racks arranged in twelve rows. In one embodiment, each row of equipment racks 76-1 to 76-12 may include a predetermined number (e.g., 10-12) of equipment racks.

The hot aisles 78-1 to 78-7 are contained by the roof 74 of the data center module 70 in which the entire roof area disposed above the rows of equipment racks 76-1 to 76-12 can be used for hot air return via the common roof or supply air plenum 82. As shown, the supply air plenum 82 is in fluid communication with a common hot aisle plenum (external duct) 84, which in turn is in fluid communication with six air economizer units, i.e., cooling units 86-1, 86-2, 86-3, 86-4, 86-5, 86-6. The air economizer units 86-1 to 86-6 are provided to treat and condition the hot air to a predetermined temperature. As will be discussed below, the treated cold air is delivered back to the cold aisles 80-1 to 80-6.

The cooling units 86-1 to 86-6 are configured to provide cool air to the cold aisles 80-1 to 80-6, and are in fluid communication with a common cold aisle plenum (external duct) 88 disposed below the common hot aisle plenum 84, which in turn is in fluid communication with another common cold aisle plenum (internal duct) 90 provided at the backs of the rows of equipment racks 76-1 to 76-6. As mentioned above, hot or supply air is provided to the cooling units 86-1 to 86-6 by the supply air plenum 82 and the hot aisle plenum 84.

In one embodiment, each cold aisle 80-1 to 80-6 includes a plurality of ceiling panels together indicated at 92 to enclose the cold aisle. Specifically, several ceiling panels 92 are provided to span the cold aisle 80-1 to 80-6 between adjacent rows of equipment racks 78-1 to 78-12 to completely enclose the cold aisle. Each cold aisle 80-1 to 80-6 is used for distributing cold air. In this embodiment, the hot aisles 78-1 to 78-7 are contained solely within the common roof plenum 82 defined by the roof 74 disposed above the rows of equipment racks 76-1 to 76-12.

The cold aisle ceiling panels used to enclose the cold aisle have a particular advantage when used as a prefabrication application (and, possibly, used in traditional facilities), which are difficult to install in raised floor and dropped ceiling applications because of limited vertical space limit. The use of such ceiling panels to create the cold aisle is less expensive, less complex, simplifies infrastructure, such as cable management, and can be largely pre-built as part of the prefabrication construction, unlike dropped ceiling systems.

Such a cold aisle system can be installed in one end/side, such as an indirect air economizer or a direct air economizer, and also when there are high/low density and dynamic IT loads.

Moreover, the hot air return plenum reduces cooler operating external static pressure, improves fan efficiency, and reduces energy consumption. Also, the hot air return plenum can resolve hot spot issue because of high density racks in a specific area of the data center.

The airflow distribution and management architecture of embodiments of the present disclosure can be used in multiple bay module designs and for customer project conceptual designs.

Embodiments of the airflow distribution and management architecture can include the following subsystems:

1. Two common cold aisles for cold air distribution and sharing, one is on the end of coolers are installed, the other is on the further end.

2. Cold aisle ceiling panel as cold aisle containment to isolate cold air and hot air.

3. Entire roof space as hot air plenum, which is wide open to all hot aisles and each rack, which will help to neutralize hot air from high and low density racks and average heat load on each cooler, as well as eliminate the issue of not evenly deploy coolers in entire IT space.

Thus, it should be observed that the systems and methods of containing air within a data center as disclosed herein are particularly effective in controlling the flow of air. The systems and methods disclosed herein reduce the cost and installation time as compared to prior systems. The systems and methods further are adapted to be installed in existing data centers without extraordinary customization. In this regard, the systems and methods are particularly suited for accommodating any aisle width or rack height. Moreover, embodiments of the hot aisle air containment system may be secured or otherwise attached to any regular or irregular surface, and are not restricted to only attach to a rack or flat wall.

The aspects disclosed herein in accordance with the present disclosure, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A data center comprising:
   a structure including a floor, walls and a roof; and
   a plurality of rows of equipment racks positioned within the structure, the rows of equipment racks being arranged parallel to one another, the rows of equipment racks defining alternating hot aisles and cold aisles,
   wherein each hot aisle is contained within the structure and in fluid communication with a hot aisle return,
   wherein each cold aisle includes a plurality of ceiling panels to contain air in the cold aisle, each ceiling panel being configured to extend between equipment racks of adjacent rows of equipment racks to define the cold aisle and/or configured to extend between equipment racks of a row of equipment racks and an aisle end wall to define the cold aisle, and
   wherein at least one row of equipment racks has a back adjacent to a common cold aisle.

2. The data center of claim 1, wherein each ceiling panel, when extending between equipment racks of adjacent rows of equipment racks to define the cold aisle, is secured to a brush strip mounted on a top of the equipment racks.

3. The data center of claim 1, wherein each ceiling panel, when extending between equipment racks of a row of equipment racks and an aisle end wall to define the cold aisle, is secured at one end to a brush strip on top of the equipment rack and at an opposite end to the aisle end wall by another brush strip.

4. The data center of claim 1, wherein each ceiling panel has a width equivalent to a width of the equipment rack and a length sufficient to span a distance between adjacent rows of equipment racks.

5. The data center of claim 1, further comprising a common roof plenum disposed above the rows of equipment racks in fluid communication with one or more cooling units, the common roof plenum functioning as the hot aisle return.

6. A data center comprising:
   a data center module including a frame structure having floor, walls and a roof, the data center module being configured to house a plurality of rows of equipment racks positioned within the frame structure, the rows of equipment racks being arranged parallel to one another, the rows of equipment racks defining alternating hot aisles and cold aisles, the data center module further including a common roof plenum disposed between the roof and the rows of equipment racks to contain and exhaust hot air from the data center module and a common cold aisle to receive cold air and deliver cold air to the data center module, wherein at least one row of equipment racks has a back adjacent to the common cold aisle;
   an external duct that functions to receive exhausted hot air from the common roof plenum and to deliver cool air to the common cold aisle; and
   at least one cooling unit in fluid communication with the external duct, the at least one cooling unit being configured to treat hot air delivered to the at least one cooling unit from the common roof plenum via the external duct.

7. The data center of claim 6, wherein each cold aisle includes a plurality of ceiling panels to contain air in the cold aisle.

8. The data center of claim 7, wherein each ceiling panel is configured to extend between equipment racks of adjacent rows of equipment racks to define the cold aisle and/or configured to extend between equipment racks of a row of equipment racks and an aisle end wall to define the cold aisle.

9. The data center of claim 8, wherein each ceiling panel, when extending between equipment racks of adjacent rows of equipment racks to define the cold aisle, is secured to a brush strip mounted on a top of the equipment racks.

10. The data center of claim 8, wherein each ceiling panel, when extending between equipment racks of a row of equipment racks and an aisle end wall to define the cold aisle, is secured at one end to a brush strip on top of the equipment rack and at an opposite end to the aisle end wall by another brush strip.

11. The data center of claim 7, wherein each ceiling panel has a width equivalent to a width of the equipment rack and a length sufficient to span a distance between adjacent rows of equipment racks.

12. The data center of claim 7, wherein each ceiling panel is suspended from the roof and configured to extend between equipment racks of adjacent rows of equipment racks to define the cold aisle and/or configured to extend between equipment racks of a row of equipment racks and an aisle end wall to define the cold aisle.

13. A method of managing airflow within a data center including a plurality of rows of equipment racks positioned within the structure, the rows of equipment racks being arranged parallel to one another, the rows of equipment racks defining alternating hot aisles and cold aisles, the method comprising:
   delivering hot air to a common roof plenum disposed between a roof of the data center and rows of equipment racks, the common roof plenum being configured to contain and exhaust hot air from the data center module;
   delivering hot air from the common roof plenum to an external duct that functions to receive exhausted hot air from the common roof plenum;
   treating hot air from the external duct by one or more cooling unit in fluid communication with the external duct; and
   delivering treated air from the external duct to a common cold aisle in fluid communication with the cold aisles, wherein at least one row of equipment racks has a back adjacent to a common cold aisle.

14. The method of claim 13, further comprising containing treated air within the cold aisle by a plurality of ceiling panels to contain air in the cold aisle.

15. The method of claim 14, wherein each ceiling panel is configured to extend between equipment racks of adjacent rows of equipment racks to define the cold aisle and/or configured to extend between equipment racks of a row of equipment racks and an aisle end wall to define the cold aisle.

16. The method of claim 14, further comprising sealing each ceiling panel, when extending between equipment racks of adjacent rows of equipment racks to define the cold aisle, with a brush strip mounted on tops of the equipment racks.

17. The method of claim 14, further comprising sealing each ceiling panel, when extending between equipment racks of a row of equipment racks and an aisle end wall to define the cold aisle, with a brush strip on top of the equipment rack and at an opposite end to the aisle end wall by another brush strip.

18. The method of claim 14, wherein each ceiling panel has a width equivalent to a width of the equipment rack and a length sufficient to span a distance between adjacent rows of equipment racks.

\* \* \* \* \*